United States Patent [19]
Akimoto et al.

[11] Patent Number: 5,312,487
[45] Date of Patent: May 17, 1994

[54] COATING APPARATUS

[75] Inventors: Masami Akimoto; Akihiro Fujimoto; Haruo Iwatsu, all of Kumamoto, Japan

[73] Assignees: Tokyo Electron Kabushiki Kaisha; Tokyo Electron Kyushu Kabushiki Kaisha, both of Japan

[21] Appl. No.: 946,853

[22] Filed: Sep. 18, 1992

[30] Foreign Application Priority Data

Sep. 20, 1991 [JP] Japan .................. 3-268644
Dec. 5, 1991 [JP] Japan .................. 3-348428
Mar. 16, 1992 [JP] Japan .................. 4-090249

[51] Int. Cl.$^5$ .................................. B05C 1/00
[52] U.S. Cl. ........................ 118/52; 118/55; 118/70; 118/302
[58] Field of Search ............ 118/52, 54, 55, 70, 118/302

[56] References Cited

U.S. PATENT DOCUMENTS 2,369,592  2/1945  Marinsky .............. 118/52 X

FOREIGN PATENT DOCUMENTS 0239625 10/1986  Japan ................... 118/52
0054725  3/1988  Japan ................... 118/52
2198131  8/1990  Japan ................... 118/52

Primary Examiner—David A. Simmons
Assistant Examiner—Paul M. Rivard
Attorney, Agent, or Firm—Beveridge, DeGrandi, Weilacher & Young

[57] ABSTRACT

A coating apparatus includes a rotating and holding mechanism which holds and rotates an object to be coated, a container which encloses the rotating and holding mechanism and prevents the dispersion of coating liquid supplied to the object, a washing fitting provided to the rotating and holding mechanism and which supplies washing liquid for washing off coating liquid which has attached to the inside of container. This washing fitting has a collection pool for collecting the washing liquid, and discharge holes through which the washing liquid in the collection pool is discharged by rotation of the rotating and holding mechanism. Thus, it is possible to evenly wash off coating liquid which has attached to the inside of the container in a short time with a small amount of washing liquid.

22 Claims, 13 Drawing Sheets

COATING APPARATUS

BACKGROUND OF THE INVENTION

The present invention relates to a coating apparatus which rotates an object such as a semiconductor wafer to be coated, and coats a coating liquid to the surface thereof, and more particularly relates to a coating apparatus which can clean an inside of a container to which coating liquid dispersed by rotation of a spinner has been attached.

Conventionally, a resist rotary coating apparatus such as that shown in FIG. 17 has been used as a coating apparatus for rotating an object such as a semiconductor wafer to be coated and applying a coating thereon with a coating liquid. This coating apparatus is configured from a spin chuck 61 which is the rotation and holding means which holds a semiconductor wafer 60 horizontal and rotates it at high speed, a resist supply nozzle 62 which drops the coating liquid of resist liquid onto the semiconductor wafer 60, and an outer cup 63 and an inner cup 64 which form a container provided so as to enclose the semiconductor wafer 60 on the spin chuck 61.

The resist liquid which is dropped onto the semiconductor wafer 60 from the resist supply nozzle 62 is uniformly coated onto the semiconductor wafer 60 by the high-speed rotation of the spin chuck 61 and excess resist liquid is dispersed in the direction of the periphery of the semiconductor wafer 60 and attaches to the wall surfaces of the outer cup 63 and the inner cup 64. If the resist liquid which has attached to the wall surfaces of the outer cup 63 and the inner cup 64 stays there, then the resist will form a layer and dry. The dried resist liquid will then flake from the wall surfaces of the outer cup 63 and the inner cup 64 when there is an impact force or the like and will be dispersed as particles which will contaminate the semiconductor wafer 60 and lower the yield of wafers. Because of this, the outer cup 63 and the inner cup 64 are periodically removed and the substances attached to them are removed by washing. However, this washing operation takes a large amount of time and trouble.

With respect to this, this coating apparatus is provided with a washing mechanism which automatically removes the resist which has adhered to the outer cup 63 and the inner cup 64. More specifically, as shown in FIG. 17 and FIG. 18, the cups 63, 64 are formed with lead-in paths 65a, 65b which lead the washing liquid L which dissolves the resist, ring-shaped supply paths 66a, 66b for the distribution and supply of the washing liquid L which has been led in from the lead-in paths 65a, 65b to around the entire periphery of the cups 63, 64, and a plural number of small holes 67 for conducting the washing liquid L of the ring-shaped supply paths 66a, 66b to the surface to which the resist is attached. A washing liquid lead-in tube 69 is connected to the lead-in path 65 via a connector 68. Then, the washing liquid L which has been supplied to the ring-shaped supply paths 66a, 66b passes through each of the small holes 67 and flows out over the entire outer peripheral surface of the inner cup 64 and the entire inner peripheral surface of the outer cup 63.

In addition, as shown in FIG. 19, there has been proposed a technology (See Japanese Patent Laid-Open Publication No. 184725-1983, Japanese Patent Laid-Open Publication No. 73630-1987) wherein a separate washing means has a dummy wafer 70 mounted on a spin chuck 61 and the washing liquid L is supplied to the dummy wafer 70 from a washing liquid supply nozzle 62 while the spin chuck 61 is being rotated at high speed.

In addition to this, technologies have also been disclosed for this type of washing apparatus, as for example in Japanese Patent Laid-Open Publication Nos. 211226-1984, 73629-1987, 41630-1988 and Japanese Utility Model Laid-Open Publication No. 25665-1989.

However, with the washing mechanisms in the coating apparatus described above, as shown in FIG. 17 and in FIG. 18, the structure of the outer cup 63 and the inner cup 64 becomes complex and expensive, as a consequence, and the processing and mounting are also difficult. In addition, the washing liquid L flows through hundreds of small holes 67 but since the washing liquid L flows more easily along paths in which it has flowed before, the washing liquid L does not flow uniformly across the entire surface of the outer cup 63 and inner cup 64, and there is therefore the problem of uneven washing. Furthermore, with this washing mechanism, the method is such that the washing liquid L flows a little at a time and dissolves the resist and so washing not only takes a long time, but there is also a high consumption of the washing liquid L. In addition, there is also the danger of various types of trouble such as the washing liquid L leaking from the connector 68. Furthermore, it is difficult to control the direction of dispersion of the washing liquid, and here is also the problem that the cup cannot be effectively cleaned.

In addition, with the latter apparatus, that is, the apparatus shown in FIG. 18, there is the possibility that the amount of washing liquid consumed can be reduced along with the time required for washing but the carrying in and out of the dummy wafer 70 takes time, and it is also necessary to manually take the standby spacer for the dummy wafer 70 in and out. Furthermore, there is also the problem that the particles, which have adhered to the surface of the dummy wafer 70, attach to the spin chuck 61 and contaminate the semiconductor wafer 60.

SUMMARY OF THE INVENTION

An object of the present invention is to provide a coating apparatus having a simple structure and which can efficiently and in a short time, and with a small amount of washing liquid perform the uniform washing of coating liquid which has attached to inside a container.

The present invention is a coating apparatus which comprises a rotation and holding means which holds and rotates an object for coating, and a container which is provided so as to enclose this rotating and holding means and which is for preventing the dispersion of coating liquid which is supplied to the object for coating, and has a washing fitting for the supply of washing liquid for washing the coating liquid which has attached to inside the container, and which has at its center a collection pool for collecting the washing liquid, and discharge holes through which the washing liquid in the collection pool is discharged by the rotation of the rotating and holding means.

In this invention, the object for coating can be a semiconductor wafer, a printed circuit board, an LCD substrate or the like, and the present invention can be applied to apparatus which performs resist liquid coating processing, developing liquid coating processing, etching coating processing, magnetic liquid coating processing and the like.

Also, the washing fitting described above is not immersed in the washing liquid which may be a solvent which dissolves the coating liquid, and can be of a material which has a light specific gravity and which can be rotated at high speed by the rotating and holding means, and for example, can be of a material such as Delrene, Teflon (registered trademarks), or polyvinyl chloride or the like. In addition, the discharge holes provided to the washing fitting can, for example, be provided one each to the upper, middle and lower stages.

The washing fitting mounted to the rotation and holding means supplies either a predetermined amount or a suitable amount of washing liquid from the washing liquid supply nozzle while it is rotating. Due to centrifugal force accompanying the rotation of the rotating and holding means, the washing liquid which is supplied to the washing fitting collects in the collection pool on the side of the peripheral portion of the washing fitting, and furthermore, receives the rotational force and the centrifugal force due to the rotation of the rotating and holding means, is dispersed at high speed from the discharge holes and hits the inner surface of the container. The washing liquid is stored for a time in the collecting pool and the washing liquid which has a large amount of motion is, for example, continuously discharged from the discharge holes and so the coating liquid which has attached to the walls of the container is promptly washed off and removed. In addition, the discharge holes are formed in plural at the top and bottom of the washing fitting and so the washing liquid is dispersed widely across the inner surface of the container.

DETAILED DESCRIPTION OF PREFERRED EMBODIMENTS

[First Embodiment]

The following is a detailed description of a first embodiment of the present invention with reference to the drawings. This first embodiment applies the coating apparatus of the present invention to a resist film formation apparatus.

Figure 1:
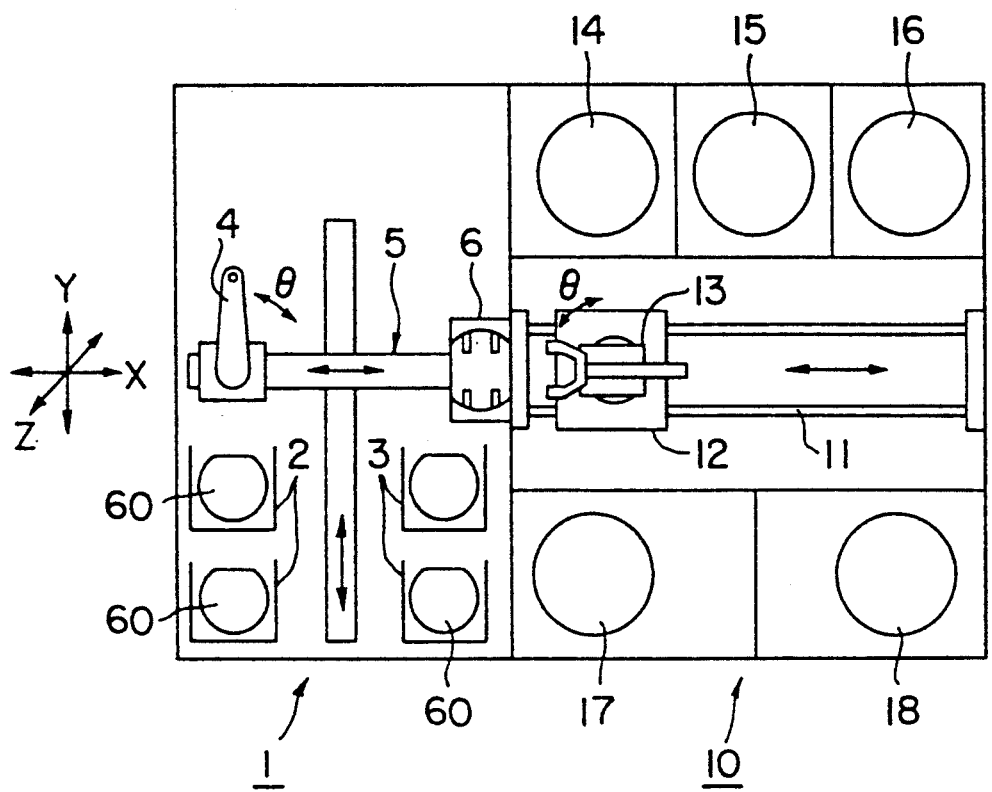
FIG. 1 is an outline plan view showing an embodiment of the coating apparatus of the present invention suited to a resist film growth apparatus.

As shown in the plan view of FIG. 1, this resist film formation apparatus is mainly configured from a processing mechanism unit 10 having a processing mechanism arranged to implement various types of processing to a semiconductor wafer 60 (hereinafter referred to as a wafer) which is the object to be coated thereon and a transfer mechanism 1 for automatically carrying the processing mechanism unit 10 in to and out of the processing mechanism unit 10.

This transfer mechanism 1 is provided with a wafer carrier 2 which houses the wafer 60 prior to processing, a wafer carrier 3 which houses the wafer 60 after processing, an arm 4 which holds the wafer 60 by suction, a moving mechanism 5 which moves the arm 4 in the X, Y, Z and $\theta$ directions, and an alignment stage 6 which aligns the wafer 60 and receives and passes the wafer 60 to the processing mechanism unit 10. Moreover, the processing mechanism unit 10 is connected to an exposure apparatus (not shown).

The processing mechanism unit 10 is provided with a conveyor mechanism 12 which moves freely along the conveyor path 11 formed in the X direction from the alignment stage 6. The conveyor mechanism 12 is provided with a main arm 13 which moves freely in the Y, Z and $\theta$ directions. On one of the sides of the conveyor path 11 is arranged an adhesion processing mechanism 14 which performs adhesion processing to improve the adhesion between the wafer 60 and the resist liquid film, a pre-bake apparatus to heat and vaporize the solvent which remains in the resist liquid which is applied to the wafer 60, and a cooling mechanism 16 which cools the wafer 60 after heat treatment. In addition, the other side of the conveyor path 11 has arranged to it a coating apparatus 17 which applies a resist to the surface of the wafer 60 and a surface cover layer coating mechanism 18 to form a coating of CEL film or the like onto the resist of the wafer 60 so as to prevent the dispersion and reflection of light when there is exposure processing.

First, the wafer 60 which has not yet been processed is carried from the wafer carrier 2 by the arm 4 of the transfer mechanism 1 and is placed upon the alignment stage 6. After this, the wafer 60 on the alignment stage 6 is held by the main arm 13 of the conveyor mechanism 12 and is carried to each of the processing mechanisms 14–18. Then, after processing, the wafer 60 is returned to the alignment stage 6 by the main arm 13 and furthermore is carried by the arm 4 and stored in the wafer carrier 3.

Figure 2:
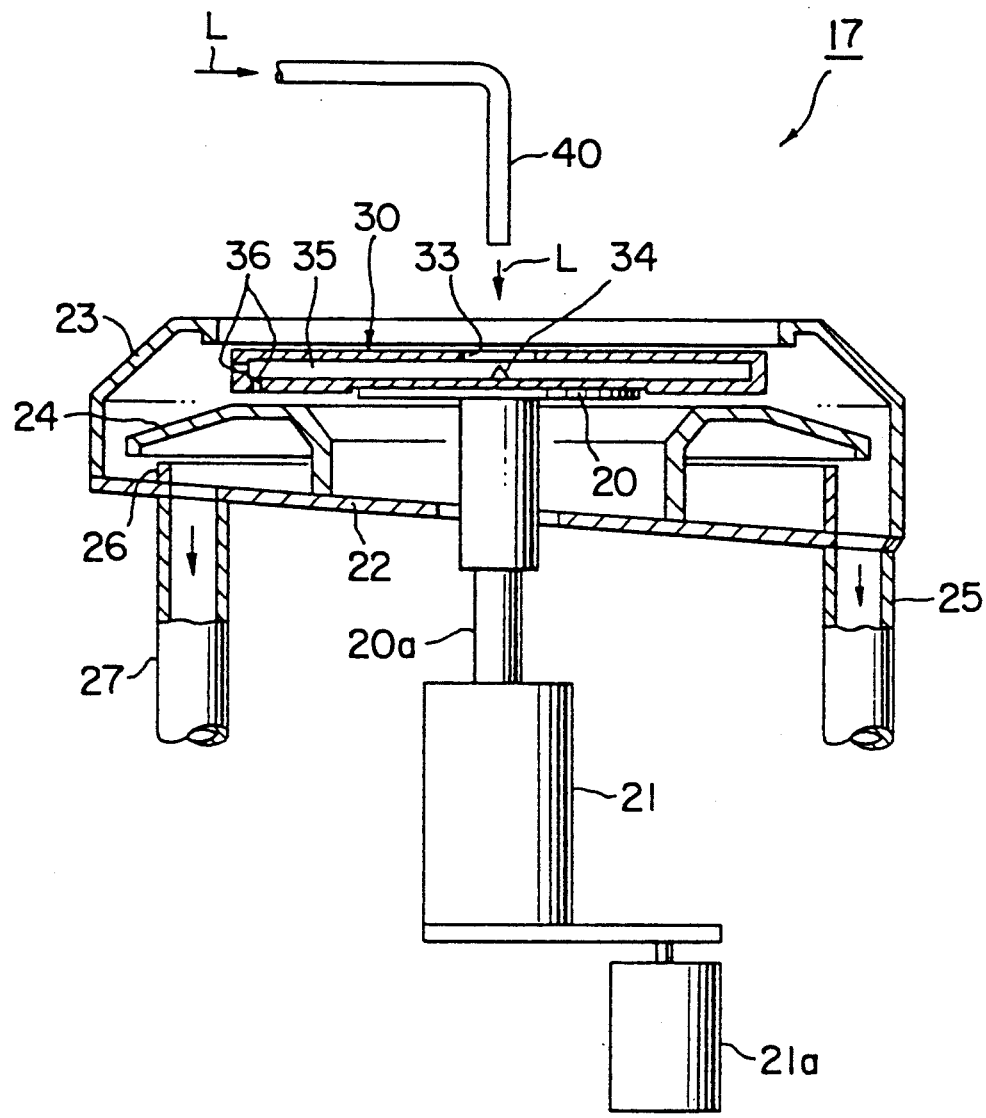
FIG. 2 is a longitudinal sectional view of one embodiment of the coating apparatus of the present invention.

The following is a description of the coating apparatus 17, with reference to FIG. 2. This coating apparatus 17 is a spin coater and has a spin chuck 20 which is the holding and rotating means which suction holds and rotates the wafer 60 (not shown in FIG. 2). This spin chuck 20 is linked to a spin motor 21 which is rotationally driven, and the spin motor 21 can control the spin chuck 20 so that it is rotated at the required speed. In addition, an air cylinder 21a can raise and lower the spin chuck 20.

Furthermore, a bottom plate 22 is provided so as to contact the periphery of the lower portion of the spin chuck 20 and on this bottom plate 22 are provided an outer cup 23 and an inner cup 24 which comprise the dispersion prevention container for the coating liquid so as to enclose the wafer 60 which is loaded onto the spin chuck 20. The outer cup 23 and the inner cup 24 are comprised of either stainless steel or polypropylene and are formed so as to be inclined downwards towards the outside of the spin chuck 20 and so as to lead the dispersed resist liquid to the bottom plate 22. The bottom plate 22 is provided on a slight incline and the lowest portion of the incline of the bottom plate 22 is connected to a discharge pipe 25 which discharges the resist liquid and the like. In addition, there is also provided a ring-shaped partition wall 26 so as to prevent the entry of the discharged liquid into the bottom plate 22 and to the bottom plate 22 on the inner side of the partition wall 26 is connected an exhaust pipe 27 to exhaust gases from the inside of both cups.

The resist liquid coating processing to the wafer 60 is performed by using the conveyor arm of the conveyor apparatus to load the wafer 60, to drop drops of the resist liquid onto the surface of the wafer 60 from the resist supply nozzle (not shown), and to rotate the spin chuck 20 at a speed of 3,000 r.p.m. When this resist liquid coating processing is repeated several times, the dispersed resist liquid attaches in layers to the wall surfaces of the outer cup 23 and the inner cup 24. The outer cup 23 and the inner cup 24 are mounted to a coating apparatus in a manner whereby they can be exchanged. However, the resist liquid which has attached to the wall surfaces of the washing cups 23, 24 becomes particles which are dispersed again while coating processing is being performed, and attach to the surface of the wafer 60, and often become a cause of a lowering of the yield. With respect to this problem, the present embodiment is provided with a function for automatic cleaning and so it is possible to automatically program the washing process. More specifically, the cleaning fitting 30 is used to perform washing and removal of the resist liquid which has attached to the wall surface of the washing cups 23, 24.

As shown in FIG. 2, this cleaning fitting 30 has a circular disk shape which is substantially similar to that of the wafer 60 and a cavity is formed inside the cleaning fitting 30.

Figure 3:
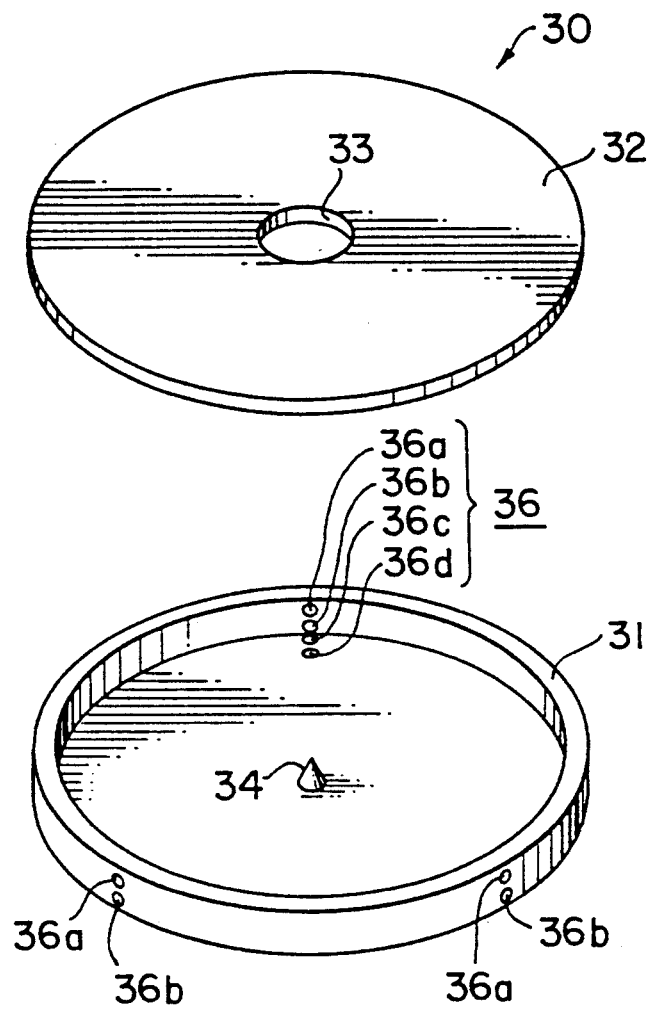
FIG. 3 is a perspective disassembly view of a washing fitting used in the coating apparatus shown in FIG. 2.

More specifically, as shown in FIG. 3, it is comprised of a receiver portion 31 and a lid portion 32 which is attached so as to cover the upper portion opening of the receiver portion 31. This material can be Delrene or Teflon (registered trademarks) or some other material which is solvent resistant and which has a light specific gravity. The shape need not necessarily be the same as that of the wafer 60, and can be square or some other shape selected in accordance with the cleaning effect. In addition, the material can be some material other than Delrene, such as a plate of aluminum or some other metal.

Figure 4:
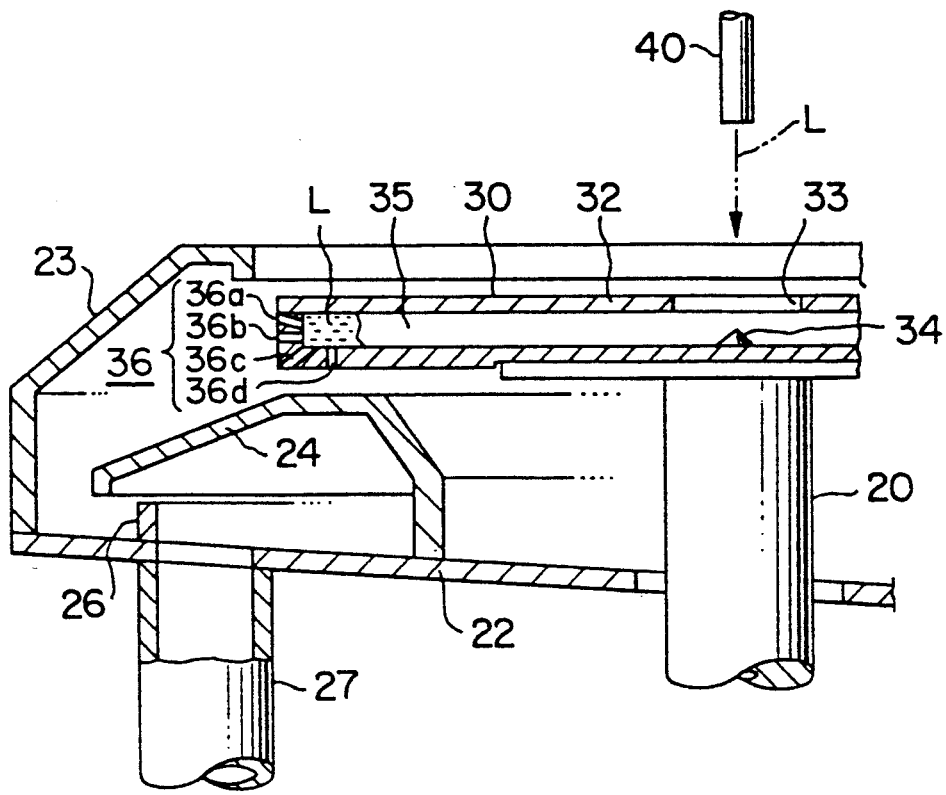
FIG. 4 is a partial, enlarged longitudinal sectional view of the coating apparatus shown in FIG. 4.

As shown in FIG. 2 and FIG. 4, when the cups are washed, the cleaning fitting 30 is held by suction to the spin chuck 20 and above the center of the spin chuck 20 is the washing liquid supply means which supplies the washing liquid L (such as thinner), and as shown in FIG. 3, the washing liquid supply nozzle 40 has an introduction opening 33 formed in the center of the cleaning fitting 30 so as to lead the washing liquid L into the cleaning fitting 30 from the washing liquid supply nozzle 40 which is arranged so as to move up and down and forwards and backwards. In addition, in the center of the receiver portion 31 which is contacted by the washing liquid L, there is formed a conical protrusion 34 which equally distributes and supplies the washing liquid L over the entire periphery of the inside of the cleaning fitting 30.

Furthermore, on the side of the periphery of the inside of the cleaning fitting 30 is formed a pool portion 35 which can stores the washing liquid L which is collected there by centrifugal force applied thereto.

In addition, so that the washing liquid L which has collected in the pool portion 35 can be discharged in the direction of the outer cup 23 and the inner cup 24, a plural number of discharge holes 36 are formed in the cleaning fitting 30. These discharge holes 36 are comprised of the discharge hole 36b which is formed horizontal with the peripheral wall of the receiver portion 31, the discharge hole 36a which is formed facing upwards on the outside of the radius, the discharge hole 36c which is formed facing downwards on the outside of the radius, and the discharge hole 36d which is formed in the vertical direction. These discharge holes 36a–36d are provided at three places, for example, spaced at equal intervals around the outside of the receiver portion 31.

The cup washing is performed after the execution of resist coating processing for a required number of times (such as 50) or after the beginning of loading. When cup washing is performed, a cleaning fitting 30 on standby in a standby station (not shown) above the alignment stage 6 and the cooling mechanism 16 and the like is held by a main arm 13 and loaded to the spin chuck 20. In addition, instead of the resist supply nozzle (not shown) used when there is resist coating processing, the washing liquid supply nozzle 40 is moved and set on the center of the spin chuck 20. Then, the washing liquid L is made to flow from the washing liquid supply nozzle 40 and is supplied from the introduction opening 33 to inside the cleaning fitting 30. The introduction opening 33 is desirably at the center of rotation of the cleaning fitting 30. Moreover, the washing liquid L is supplied while the spin chuck 20 is rotating.

When the cleaning fitting 30 has stopped or when the drive of the spin chuck 20 is a low speed (50–100 r.p.m.), the cleaning fitting 30 of the pool portion 35 has flow mainly from the discharge hole 36d and the inner cup 24 is washed. Furthermore, when the cleaning fitting 30 is rotating at medium-to-high speed (500–1,000 r.p.m.), the washing liquid L which has collected in the pool portion 35 by centrifugal force is discharged at high speed from mainly the discharge holes 36a, 36b and 36c. The washing liquid L which is discharged from the discharge holes 36a, 36b hits the peripheral wall on the inside of the outer cup 23 and the resist liquid which has attached there is washed off. In addition, the washing liquid L which is discharged from the discharge hole 36c strikes the upper surface of the outer periphery of the inner cup 24 and performs washing of the wall surface of the inner cup 24.

In this manner, the centrifugal force due to the rotation of the cleaning fitting 30 causes the washing liquid L which moves to the outer peripheral portion to be temporarily stored in the pool portion 35 and for this stored washing liquid L to be discharged from the discharge holes 36 so that it is possible for a certain amount of the washing liquid L to be continuously discharged, and for washing of the wall surface of the cup to be effectively performed. In addition, a plural number of the discharge holes 36 are formed at a required (acute or obtuse) angle from the horizontal surface and so it is possible for the washing liquid L to be distributed over a wide range of the wall surfaces of the outer cup 23 and the inner cup 24.

Figure 5:
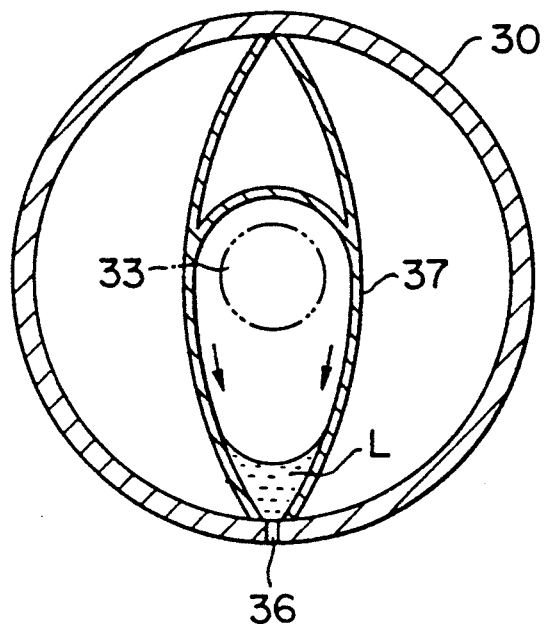
FIG. 5 is a lateral sectional view showing another embodiment of the washing apparatus shown in FIG. 3.

Moreover, in this embodiment, the discharge holes 36a–36d are provided at three places as shown in FIG. 3 but as shown in FIG. 5, they can also be provided at only one place (or at two places, symmetrically). If the number of the discharge holes 36 (discharge hole groups) is decreased then the rotation of the cleaning fitting 30 by the spin chuck 20 enables there to be an increase in the amount of discharge from a single discharge hole 36. In this case, a partition wall 37 such as shown in FIG. 5 can be provided to guide the washing liquid L from only one discharge hole 36. In addition, the symmetrical extension of the partition wall 37 on the side opposite the discharge holes 36 is performed in consideration of the balance of the cleaning fitting 30 when it is rotating. In this manner, there need only be one each of the discharge holes 36a–36d and if any of these is omitted, there will be a reduction in the range of coverage of the washing liquid L which is discharged and supplied to the outer cup 23 and the inner cup 24.

In addition, in the embodiment described above, the discharge holes 36a–36d are formed in a radial direction but they can also be formed on an incline from the direction of the radius. If this is done, then the rotational speed of the spin chuck 20 and the angle and direction of inclination of the discharge holes with respect to the direction of the radius of the spin chuck 20 enables the direction of dispersion of the washing liquid L discharged from the discharge holes 36 in substantially the direction of the tangent of the cleaning fitting 30 to change to the side of the direction of the radius.

In addition, in the embodiment described above, the discharge holes 36 were formed in the wall of the cleaning fitting 30 but they can also be formed as discharge holes which extend the nozzle from the pool portion 35. In addition, the cleaning fitting 30 need not be circular in shape, and can be oval or polygonal as long as it is a plate shape which can be mounted on the spin chuck 20. Moreover, the rotational speed of the cleaning fitting 30 can be selected from the status of dispersion of the washing liquid L and for example is desirably set to 300–3,000 r.p.m.

Figure 6:
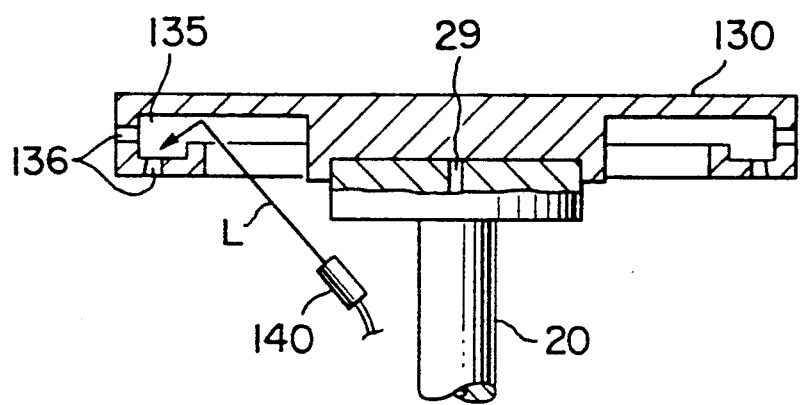
FIG. 6 is a longitudinal sectional view showing still another embodiment of the washing fitting shown in FIG. 3.

Moreover, FIG. 6 shows another embodiment of the cleaning fitting described above. This cleaning fitting 130 is provided at the side of the lower surface of the peripheral portion with discharge holes 136 for the washing liquid L and with a pool portion 135 for the washing liquid L. Then, this cleaning fitting 130 is held to the spin chuck 20 by the vacuum suction of the suction holes 29 and the washing liquid L discharged from the washing liquid supply nozzle 140 arranged in the vicinity of the spin chuck 20 is led into the pool portion 135 and discharged from the discharge holes 136 to then wash the wall surfaces of the cups. Moreover, the cleaning operation and the like are the same as for the first embodiment, and hence a description thereof will be omitted here.

As is clear from the above description, according to the first embodiment, there is provided a washing fitting which discharges washing liquid in the direction of a cup mounted on a rotating and holding means and so there is a more simple structure when compared to the conventional method where washing liquid flows from the top of a cup. In addition, a washing fitting is loaded to a rotating and holding means in the same manner as the object for coating and so it is not necessary to have any special handling, and automation of the washing process is facilitated. Furthermore, it is possible for the washing liquid to be stored in the pool portion and so it is possible to have continuous discharge from the discharge holes, in the direction of the cup, of washing liquid that has a large amount of motion for coating liquid which has attached to the wall surfaces of the cups to be effectively cleaned in a short time, using a small amount of cleaning liquid. In addition, it is also possible for the discharge holes to be formed in plural at the tops and bottoms of the cups and so it is possible for the washing liquid to be widely and uniformly supplied by the surface of the cup so that there is a large reduction in unevenness of washing.

[Second Embodiment]

Figure 7:
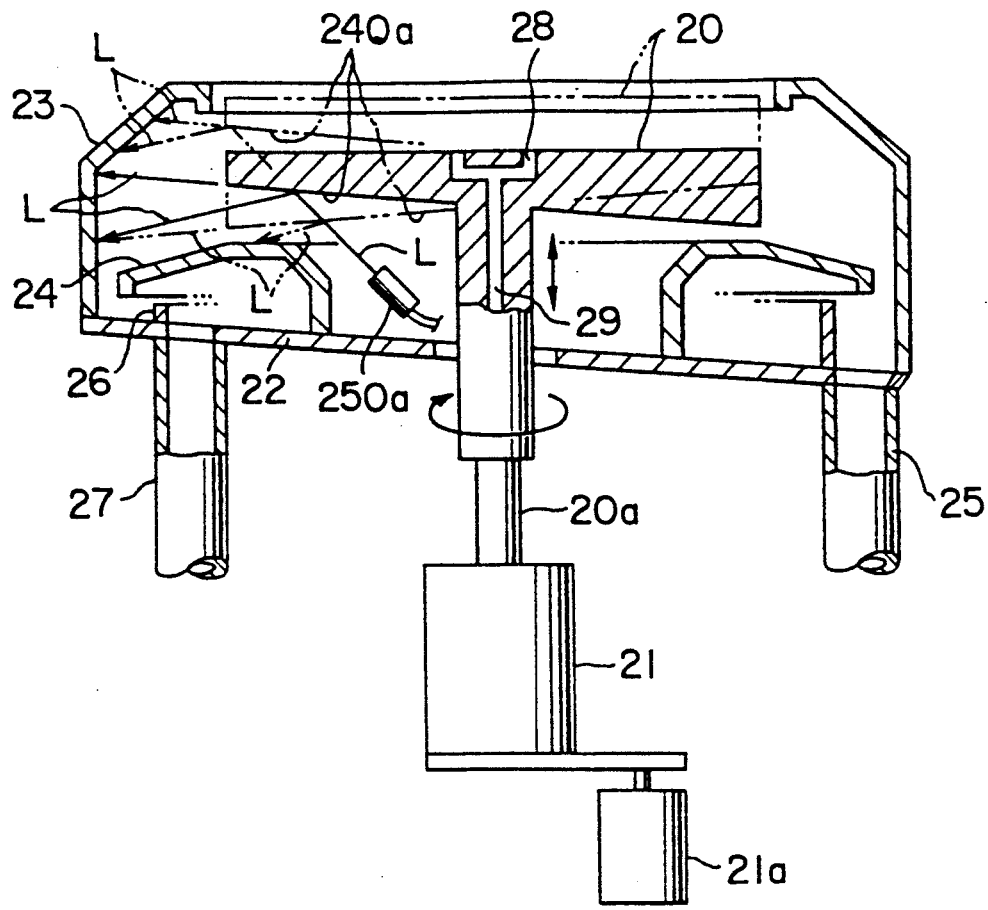
FIG. 7 is a partial longitudinal sectional view of a coating apparatus of the present invention.

FIG. 7 is a sectional view of a second embodiment of a coating apparatus of the present invention. The coating apparatus 17 of this second embodiment comprises a spin chuck 20 as the rotating and holding means which holds an upper surface of a wafer 60 (not shown in FIG. 7) by suction for example, a spin motor 21 which rotationally drives the spin chuck 20, a reciprocal motion mechanism 21a such as an air cylinder or the like which is arranged along the rotating shaft 23 which links the spin chuck 20 and the spin motor 21, and which reciprocally moves the spin chuck 20 and the rotating shaft 23 along the axis of rotation.

In the case of this second embodiment, the spin motor 21 and the spin chuck 20 have rotation control performed to a required rotational speed and the reciprocal motion mechanism 21a controls the spin chuck 20 so that it can be raised or lowered along the axis of rotation. In addition, to the side of the rear surface of the spin chuck 20, that is, the rear surface of the wafer holding portion of the spin chuck 20 is a slope (the shape of a plateau in section) which slopes from one end of the outer peripheral portion to the other end, and a washing liquid guide portion 240a is formed by a washing liquid reflection guide surface configured so that the washing liquid is reflected in the direction of the outer periphery. Furthermore, at a position near this washing liquid guide portion 240a is provided a washing liquid supply nozzle 250a which injects the washing liquid L in the direction of the washing liquid guide portion 240a.

In addition, to the periphery of the upper surface of the spin chuck 20 are provided suction holding holes 28 at suitable intervals for holding the wafer 60. These suction holes 28 are connected to a vacuum pump (not shown), via a vacuum path 29 provided in the rotating shaft 20a. In this case, it is necessary for at least the washing liquid guide portion 240a of the spin chuck 20 to have solvent resistance with respect to the washing liquid L. Because of this, the entire spin chuck 20 can for example, be formed from a solvent resistant material such as stainless steel, or the washing liquid guide portion 240a can be formed by a solvent resistant material such as Teflon or Derlin (registered trademarks) or polyvinyl chloride, or some film can be implemented to the surface thereof.

In a coating apparatus of a second embodiment of the present invention and having a configuration as described above, when resist coating processing is performed to a wafer, the wafer 60 is mounted on the spin chuck 20 and drops of resist liquid are dropped from a resist supply nozzle (not shown) onto the upper surface of the wafer 60 and the spin chuck 20 (at a speed of 3,000 r.p.m. for example). When this resist coating processing is repeated for a certain number of times, the dispersed resist liquid attaches in layers to the surface of the outer wall of the outer cup 23 and the inner cup 24.

This second embodiment is provided with a automated washing mechanism. Accordingly, it is possible to have automatic programming for the washing process. This cup washing is implemented after resist coating processing has been performed for a required number of times, or after loading has begun. At this time, the washing liquid L (such as thinner) which is sprayed from the washing liquid supply nozzle 250a, strikes the washing liquid guide portion 240a of the rear surface of the spin chuck 20, is reflected and is dispersed to the wall surface of the cup, and performs the washing and removal of the resist liquid which has attached to the wall surface of the cup. When this occurs, the surface of the washing liquid guide portion 240a is inclined with respect to the rotating shaft of the spin chuck 20 and so the washing liquid L which is reflected from it is dispersed over a wide range up and down. Furthermore, the rotation of the spin chuck 20 is controlled to a speed of from 300 to 3,000 r.p.m. for example and the spin chuck 20 moves in the direction of the axis of rotation, that is, up and down due to the reciprocal motion mechanism 21a so that there is an even wider range of dispersion of the washing liquid L which hits the washing liquid guide portion 240a and is reflected, and so that the washing liquid L is dispersed uniformly and over a wide range to the wall surfaces of the outer cup 23 and the inner cup 24. In addition, when the washing mechanism has a mechanism such as that described above, it is not necessary to provide a special washing mechanism or cleaning fitting and so it is not necessary for a special fitting to be manually carried in and out or to have a standby space for it. Accordingly, it is possible to have a simplified structure of the coating apparatus and for the entire apparatus to be made more compact.

[Third Embodiment]

Figure 8:
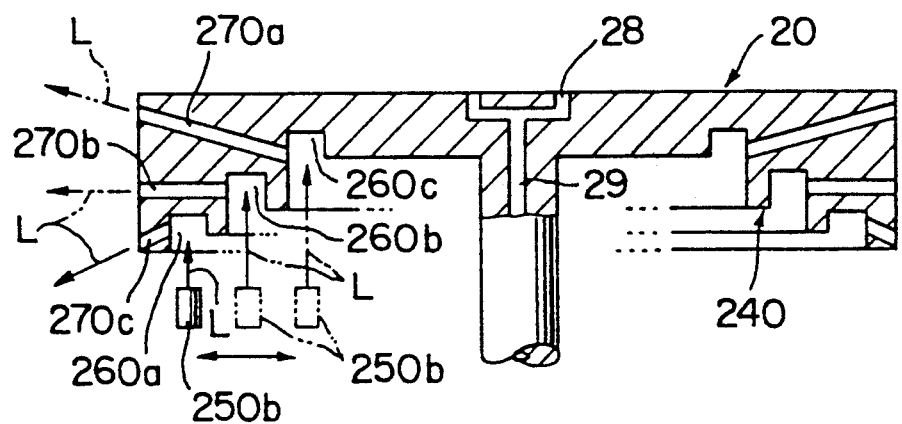
FIG. 8 is a partial longitudinal sectional view showing a third embodiment of a coating apparatus of the present invention.

FIG. 8 is a sectional view showing the main portions of a third embodiment of the coating apparatus of the present invention. In the same manner as for the second embodiment, the coating apparatus of this third embodiment is a variation of the method whereby the washing liquid L which is sprayed from the washing liquid supply nozzle 250b is dispersed to the wall surfaces of the cup by the spin chuck 20, and the spin chuck 20 as shown in FIG. 7 has the washing liquid guide portion 240a formed with a plural number of guide holes which have different discharge angles.

More specifically, as shown in FIG. 8, there are the three ring-shaped washing liquid receiver portions 260a, 260b, 260c provided to the side of the rear surface of the wafer holding portion of the spin chuck 20, and between the outer surface of the spin chuck 20 and each of the washing liquid receiver portions 260a, 260b, 260c are formed the washing liquid guide holes 270a, 270b, 270c which have different angles of inclination. Then, the washing liquid supply nozzle 250b is formed so that it is movable in the direction of the radius of the spin chuck 20 and so that the washing liquid L is supplied in the direction of each of the washing liquid receiver portions 260a, 260b, 260c.

In a coating apparatus of a third embodiment of the present invention and having a configuration as described above, the washing liquid supply nozzle 250b moves to a required position and supplies the washing liquid L to an arbitrary position on the washing liquid receiver portions 260 so that it is possible for the wall surface of the outer cup 23 and the inner cup 24 to be selectively washed. Accordingly, it is possible to have extra washing for cup wall portions which have much resist liquid attached to them.

The description above was for the case where the washing liquid supply nozzle 250b is arranged so as to be movable but it is not necessary that the washing liquid supply nozzle 250b be movable, and the direction of the spray opening of the washing liquid supply nozzle 250b can be changed to face each of the washing liquid receiver portions 260a, 260b, 260c.

Moreover, in this third embodiment, the other portions are the same as for the second embodiment described above and so the same numerals are used to denote them in the figures, and duplicate description is omitted.

[Fourth Embodiment]

Figure 9:
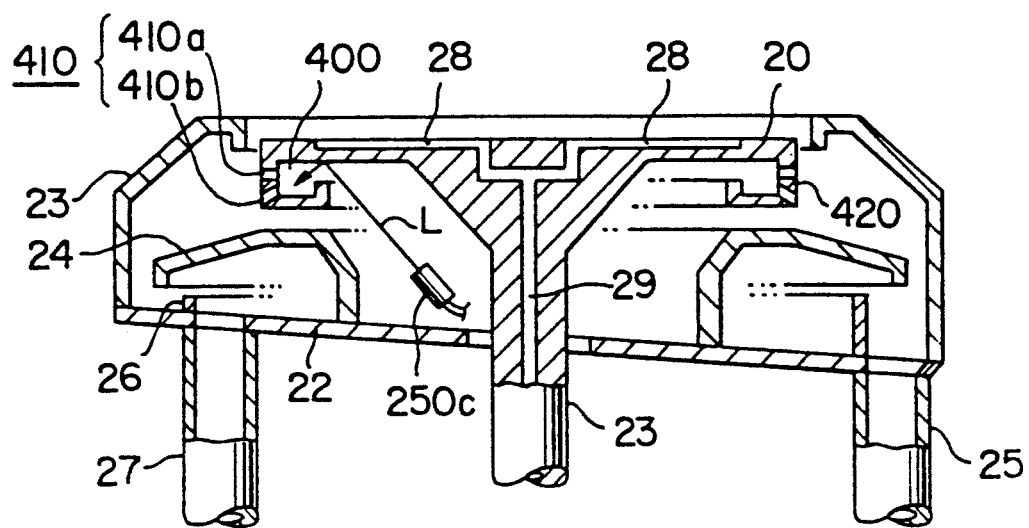
FIG. 9 is a longitudinal sectional view of a fourth embodiment of a coating apparatus of the present invention.
Figure 10:
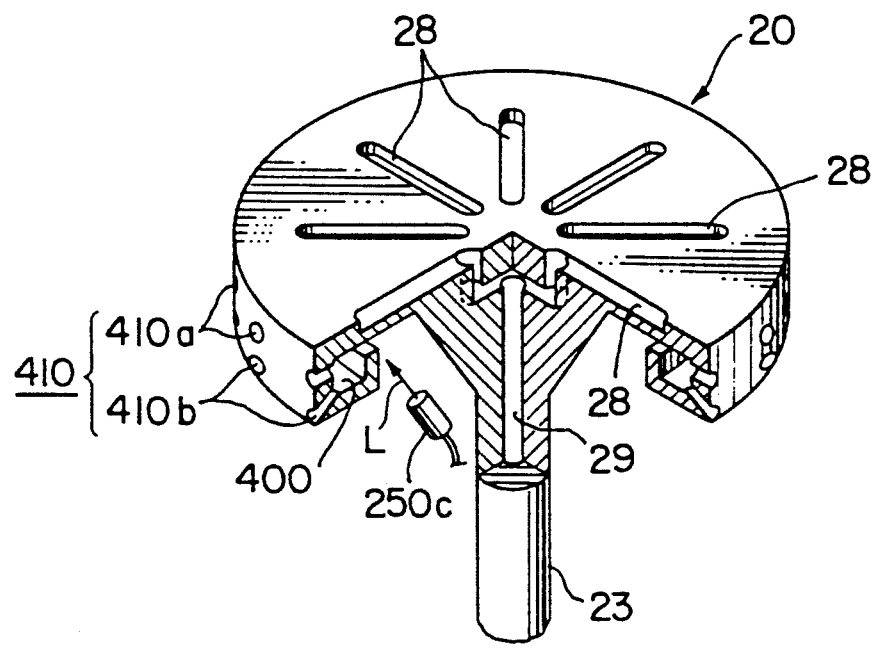
FIG. 10 is a partial sectional perspective view of a fourth embodiment of the coating apparatus shown in FIG. 9.

FIG. 9 is a longitudinal sectional view of a fourth embodiment of the coating apparatus of the present invention, and FIG. 10 is a partial sectional perspective view of the major portions thereof. The coating apparatus in this fourth embodiment has the spin chuck 20 provided with a washing liquid pool portion 400 and the washing liquid L stored in this washing liquid pool portion 400 is dispersed from the discharge holes 410 to the wall surfaces of the cup.

More specifically, a ring-shaped pool portion 400 is provided to the peripheral edge portion of the side of the rear surface of the wafer holding portion of the spin chuck 20, and the periphery of the peripheral wall 420 of the spin chuck 20 has many discharge holes 410 at required intervals, and washing liquid L from the washing liquid supply nozzle 250c arranged at the lower portion of the spin chuck 20 is supplied to inside the washing liquid pool portion 400. Moreover, in the case of the present embodiment, a plural number of discharge holes 410 are formed so that the centrifugal force due to the rotation of the spin chuck 20 causes the washing liquid L supplied to the washing liquid pool portion 400 to be uniformly dispersed in the direction of the wall surfaces of the outer cup 23 and the inner cup 24. For example, these discharge holes 410 are the discharge holes 410a formed parallel with the peripheral wall 420, and the discharge holes 410b formed so as to face downwards in the direction of the radius and at a required angle from the horizontal in the bottom wall of the washing liquid storage portion 400 underneath the discharge holes 410a. A plural number of these discharge holes 410a, 410b are formed at equal intervals around the peripheral wall 420 of the spin chuck 20. In a coating apparatus of a forth embodiment of the present invention and having the configuration described above, when the washing liquid L is suitably supplied from the washing liquid supply nozzle 250c during rotation, the centrifugal force which acts when there is high-speed rotation of the spin chuck 20 causes the washing liquid L to collect in the washing liquid pool portion 400 where it receives the influence of centrifugal force and the rotational force due to the rotation of the spin chuck 20, is dispersed and discharged at high speed and hits the wall surfaces of the cup.

When the spin chuck 20 either stops or rotates at low speed, the washing liquid of the washing liquid pool portion 400 flows down from mainly the discharge holes 410 and the inner cup 24 is washed. Furthermore, when the spin chuck 20 is rotating at medium or high speed, the washing liquid L which has collected in the washing liquid pool portion 400 due to centrifugal force is discharged at high speed from mainly the discharge holes 410a. The washing liquid L which is discharged from the discharge holes 410a hits the surface of the inner wall of the outer cup 23 and washes the outer cup 23.

In this manner, the washing liquid L is temporarily stored in the washing liquid pool portion 400 and washing liquid L which has a large amount of motion is continuously discharged from the discharge holes and therefore enables the fast cleaning and removal of the coating liquid which has adhered to the wall surfaces of the cup. When this occurs, changing the rotational speed of the spin chuck 20 allows the wall surfaces of the outer cup 23 and the inner cup 24 to be washed over a wide range. In this case, the rotational speed of the spin chuck 20 can be selected in accordance with the status of dispersion of the washing liquid L, and for example, is desirably set at a speed of from 300 to 3,000 r.p.m.

Moreover, in this fourth embodiment, the other portions are the same as for the second and third embodiments described above and so the numerals denoting them in the figures are the same, and duplicate description is omitted.

[Fifth Embodiment]

Figure 11:
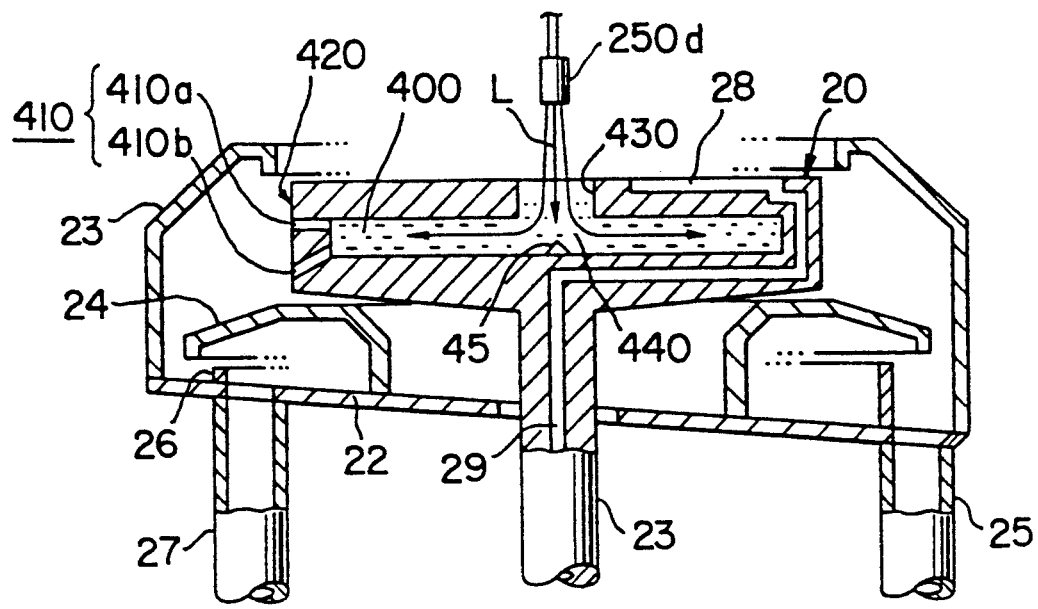
FIG. 11 is a longitudinal sectional view along the section line XI—XI of FIG. 12, showing a fifth embodiment of the coating apparatus of the present invention.
Figure 12:
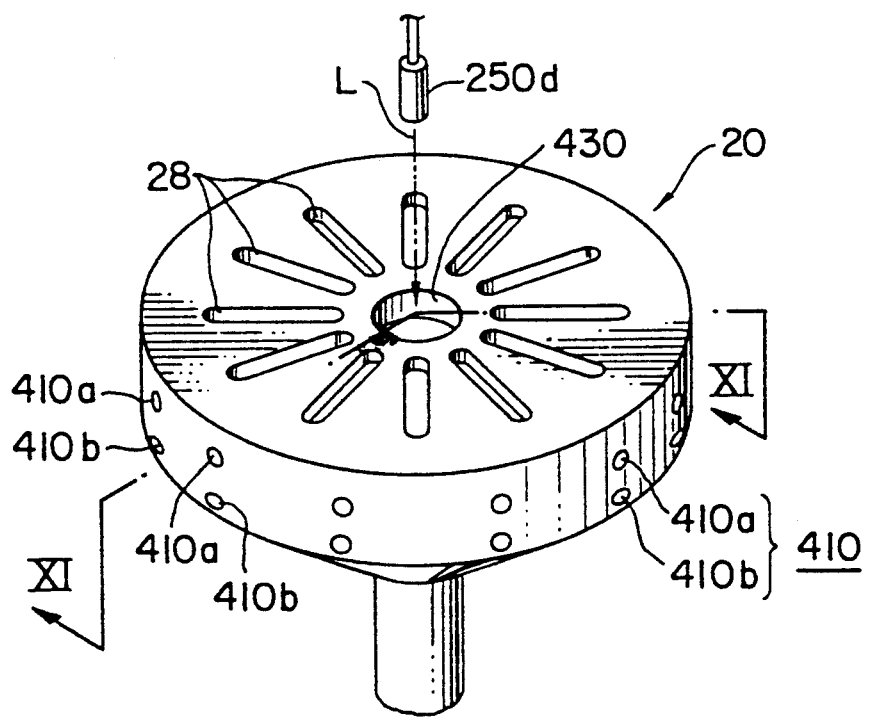
FIG. 12 is a perspective view showing an outline of the coating apparatus shown in FIG. 11.

FIG. 11 is a longitudinal sectional view of a fifth embodiment of the coating apparatus of the present invention, and FIG. 12 is an outline perspective view of the same. This fifth embodiment is the same as the fourth embodiment in that there is a different method of dispersion of the washing liquid L to the cup wall surface from the discharge hole 410 after the coating apparatus pools the washing liquid L in the washing liquid pool portion 400 provided to the spin chuck 20.

More specifically, the wafer holding portion of the spin chuck 20 is formed in a circular shape having a central cavity and the central portion of the upper surface of the wafer holding portion is provided with a washing liquid introduction opening 430, and to the and to side of the outer peripheral portion of the cavity portion 440 is provided a pool portion 400 which stores the washing liquid L which is collected in it by centrifugal force, while the peripheral wall 420 of the spin chuck 20 is provided with discharge holes 410a, 410b at suitable equal intervals in the same manner as the fourth embodiment. Moreover, in order to prevent the washing liquid L from splashing back and in order for it to be evenly distributed over the entire periphery of the inner cavity portion, there is a conical protrusion 45 provided at the center of the bottom inside the cavity portion 440. In addition, at a position above the center of the spin chuck 20 is provided a washing liquid supply nozzle 250d which can move up and down.

When cup washing is performed, the washing liquid supply nozzle 250d is first set at the center portion of the washing liquid supply nozzle 250d instead of the resist supply nozzle (not shown) used. Then, the washing liquid L is made to flow from the washing liquid supply nozzle 250d and is supplied to the inside of the cavity portion 440 from the washing liquid introduction opening 430. Moreover, the washing liquid L is supplied while the spin chuck 20 is rotating. The washing liquid L supplied to inside the cavity portion 440 is collected in the washing liquid pool portion 400 by the rotational force due to the rotation of the spin chuck 20 and also by centrifugal force, is discharged from the discharge holes 410a, 410b, hits the wall surfaces of the outer cup 23 and the inner cup 24 and performs washing of the resist liquid which has attached there.

In this manner, the centrifugal force due to the rotation of the spin chuck 20 causes the washing liquid L which has moved to the outer peripheral portion, to collect once in the washing liquid pool portion 400 and this collected washing liquid L is then discharged from the discharge holes 410 so that it is possible to have the continuous and high-speed ejection of a certain pooled amount of washing liquid L, and it is possible for there to be effective washing of the inner wall surfaces of the cup. In addition, a plural number of the discharge holes 410 are formed at a required (acute or obtuse) angle from the horizontal so that it is possible for the washing liquid L to be distributed for a wide range of the wall surfaces of the outer cup 23 and the inner cup 24.

Moreover, the other portions of this fifth embodiment are the same as the second through fourth embodiments and so the same numerals are used to denote them in the figures, and duplicate descriptions of them are omitted.

Moreover, in the fourth and fifth embodiments described above, the discharge holes 410a,410b are provided in plural but can only be provided singlely (see FIG. 5 and the description thereof).

According to a coating apparatus of the second through fifth embodiments, the washing liquid is ejected from the washing liquid supply nozzle in the direction of the washing liquid introduction hole formed in the rotating and holding means, and is distributed in the container and washing of the walls of the container performed so that it is not necessary to have a special washing fitting, and it is possible to perform efficient washing in a short time and using a small amount of washing liquid. As a result, it is possible for the apparatus to be made more compact.

In addition, the rotating and holding means has a pool portion which pools the washing liquid and also has discharge holes which discharge the washing liquid which has pooled in the pool portion due to the rotation of the rotating and holding means in the direction of the container. Because of this, it is possible for the washing liquid which has pooled once in the pool portion to have a large amount of motion and to be continuously discharged from the discharge holes in a certain amount and in the direction of the container, and for the coating liquid which is attached to the inside walls of the container to be washed and removed in a short time.

Furthermore, the rotating and holding means is formed so as to be able to move reciprocally in the direction of the axis of rotation and so it is possible for the washing liquid to be uniformly distributed and supplied and for there to be less uneven washing.

[Sixth Embodiment]

Figure 13:
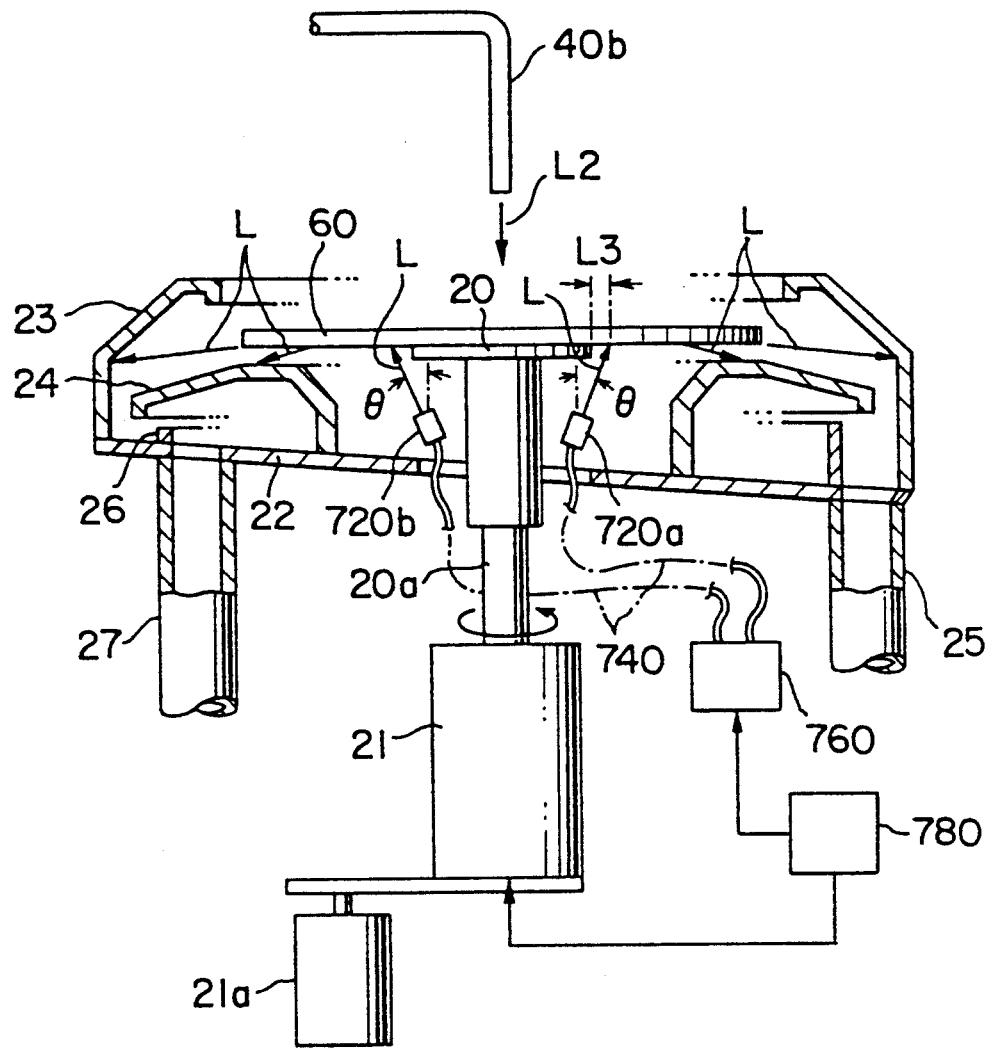
FIG. 13 is a longitudinal sectional view showing a sixth embodiment of a coating apparatus of the present invention.

FIG. 13 is a sectional view of a sixth embodiment of the coating apparatus of the present invention. In this sixth embodiment, a wafer 60 is sucked and held to the upper surface of the spin chuck 20 and underneath it are provided two or some other plural number of washing liquid discharge nozzles 720a, 720b for discharging a washing liquid L such as thinner or the like in the direction of the rear surface of the wafer 60. In particular, the washing liquid discharge nozzles 720a, 720b are arranged symmetrically about the center of rotation of the spin chuck 20 and are configured so that washing of the rear surface of wafers which have a large radius such as 8 inches or the like is performed effectively. Moreover, the number of these washing liquid discharge nozzles 720a, 720b can be one, or three or more, with there being no particular limitation. When a plural number of discharge nozzles are provided, they are arranged at equal intervals around the periphery of the spin chuck 20.

In this case, the angle of inclination $\theta$ of the washing liquid discharge nozzles 720a, 720b with respect to the vertical is set to 45° for example, and when the wafer 60 is rotating at high speed, the washing liquid L which has been dispersed by the rear side of the wafer reaches the inner wall of the outer cup 23 and the washing liquid L which is dispersed when there is low-speed rotation reaches the outer wall of the inner cup 24. Moreover, the angle of inclination described above is not limited to 45°, and can be set within a range of from 25° to 65°, and can be set according to the relationship between the spin chuck 20 and the speed of rotation.

Then, the point of intersection of the wafer 60 and the direction of the length of each of the washing liquid discharge nozzles 720a, 720b determines the nozzle position at a required distance L3 from the outer periphery of the spin chuck 20 and this distance L3 is 15 mm for example.

Then, each of the washing liquid discharge nozzles 720a, 720b is connected via a pipe 740 and the like, to a washing liquid supply portion 760 which has a supply pump, a washing liquid tank and the like. In addition, this washing liquid supply portion 760 is controlled by control signals from a control means 780 and which comprises a microprocessor or the like which has had washing processes and the like programmed beforehand. This control means 780 controls the rotational speed of the spin motor 21 and is configured so that the rotational speed of the spin chuck 20 can be changed from low speed to high speed (50-1000 r.p.m.) or viceversa, and so that the angle of dispersion and the like of the washing liquid L with respect to horizontal and which hits the rear surface of the wafer can be changed. To above the spin chuck 20 is provided a resist liquid supply nozzle 40 which freely moves forwards and backwards and left and right, and which supplies a coating liquid L2 which is a resist or the like.

The following is a description of the operation of this sixth embodiment of the present invention and which has this configuration.

This sixth embodiment of the coating apparatus of the present invention performs the following resist film formation operations.

First, the wafer 60 is loaded to the spin chuck 20 and is held by vacuum suction thereon. Then, when the wafer 60 is held in this status, the drive of the spin motor 21 rotates the spin chuck 20 and the wafer held to it at a high speed of 2,000 r.p.m. for example, while a required amount of the coating liquid L2 is dropped onto the wafer 60 and supplied from the resist liquid supply nozzle 40b at the same time. When this occurs, the atmosphere inside the cup is exhausted to a required degree of vacuum via the exhaust pipe 27.

Centrifugal force causes the coating liquid supplied from the center of the wafer 60 to be uniformly applied in a widening radius to the wafer surface, and for the excess coating liquid to be dispersed from the peripheral portion of the wafer to off of the wafer, where it then attaches to the surface of the outer wall of the inner cup 24 and to the surface of the inner wall of the outer cup 23, and this mist of coating liquid also attaches to the side and rear surfaces of the spin chuck 20. If this attached coating liquid is allowed to remain, it will become a cause of generation of particles and will lower the yield.

However, after a required number of coating processes have been completed to the wafer 60, the control means 780 drives the washing liquid supply portion 760 and washing liquid L is discharged from the washing liquid discharge nozzles 720a, 720b and performs surface washing and side rinse for the wafer 60 and the attached coating liquid is removed.

When the rear surface is washed, the washing liquid L is discharged and the spin motor 21 is controlled by the control means 780 so that the rotational speed of the wafer 60 is increased and reduced within a range of 500-2,000 r.p.m. and the and there is a corresponding increase and reduction in the amount of centrifugal force which is applied to the washing liquid L which is dispersed to hit the rear surface of the wafer 60. The washing liquid L which has been dispersed stays on the surface of the outer wall of the inner cup 24 and on the surface of the inner wall of the outer cup 23 and washes those surfaces.

Figure 14:
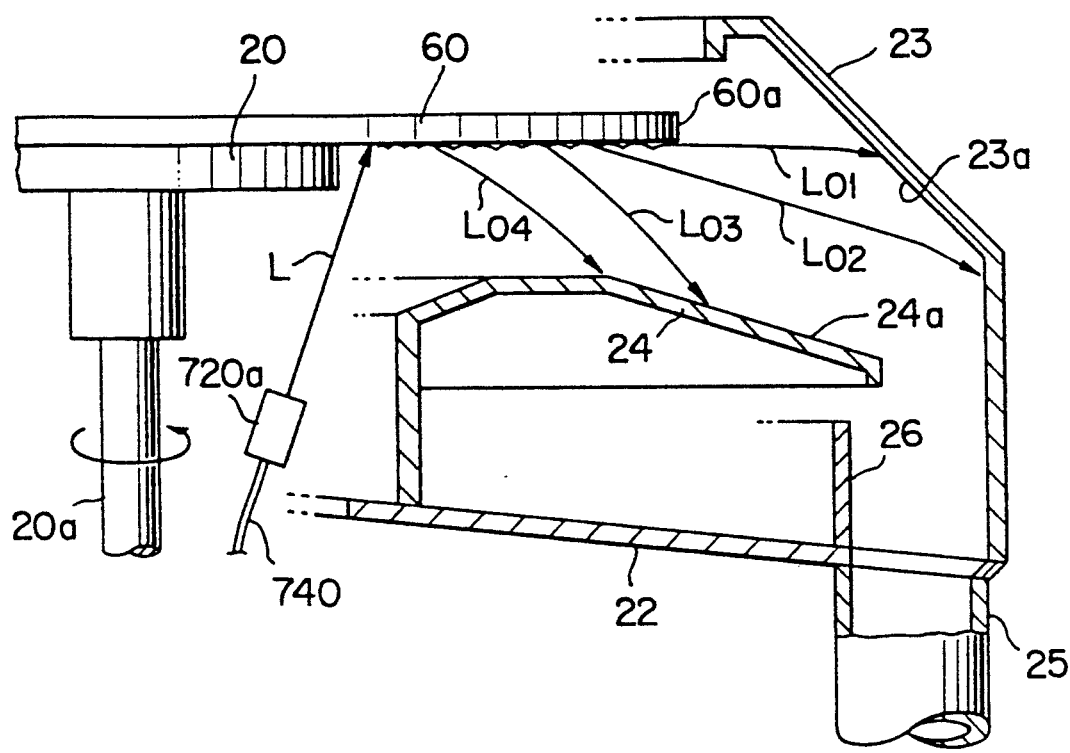
FIG. 14 is a sectional view of an outline of the coating apparatus shown in FIG. 13.

More specifically, as shown in FIG. 14 for when the wafer 60 is rotated at high speed, the washing liquid L which hits the rear surface of the wafer 60, washes the rear surface of the wafer, reaches the outer peripheral portion 60a and as shown by the arrow $L_{01}$, is dispersed in a substantially horizontal direction and washes that portion while flowing downwards.

Then, accompanying the drop in the rotational speed of the wafer 60 the direction of dispersal of the washing liquid L gradually inclines downwards from the horizontal and as shown in FIG. 14, and the washing liquid L also attaches to the outer wall surface 24a of the inner cup 24. In particular, when the rotational speed of the wafer 60 is at its lowest of for example, 50 r.p.m., the amount of centrifugal force applied to the washing liquid L is low and so the washing liquid L which hits the rear surface of the wafer inclines downwards along the direction of the radius of the wafer 60 as shown by the arrow $L_{04}$, attaches to the outer wall surface 24a of the inner cup 24, washes it and falls down.

This wafer rear surface washing operation is performed in the same time as the conventional operation for washing the rear surface of a wafer, and is completed in, for example, 10 seconds. After completion, there is spinning at high speed to shake the thinner, and this is followed by drying. After the drying of the washing liquid L has finished, the wafer 60 is then conveyed to the mechanism for the following process.

In this embodiment, the washing of the rear surface of the wafer and the washing of the wall surfaces of the outer cup 23 and the inner cup 24 are performed for each resist film formation operation performed for the wafers and so unlike the conventional apparatus, it is not necessary to set a special time for washing for each time a certain number of wafers have been processed, and it is possible to increase the throughput of resist formation processing.

In particular, in this sixth embodiment, as shown in FIG. 13, the washing liquid discharge nozzles 720a, 720b are arranged at positions symmetrical with respect to the center of rotation of the spin chuck 20 and so it is possible to have definite washing of the wall surfaces of the outer cup 23 and the inner cup 24 as well as the rear surface of the wafer 60 even if the size of the wafer 60 is as large as 8 inches for example.

Moreover, in this sixth embodiment, the rotational speed of the spin chuck 20 is set so that it can be changed over a range of 500–2,000 r.p.m. However, this speed is not limited to this, as the direction of dispersion of the washing liquid L is also dependent upon the angle of inclination $\theta$ of the washing liquid discharge nozzles 720a, 720b and so the rotational speed of the spin chuck 20 is also determined taking this angle of inclination $\theta$ into account. The rotational speed of the spin chuck 20 is then controlled so that the washing liquid attaches to the wall surfaces of the outer cup 23 and the inner cup 24. The spin chuck 20 can also be raised and lowered at this time and by doing this, it is possible to wash the upper wall surface portion of the inner cup 24 even more effectively.

[Seventh Embodiment]

Figure 15:
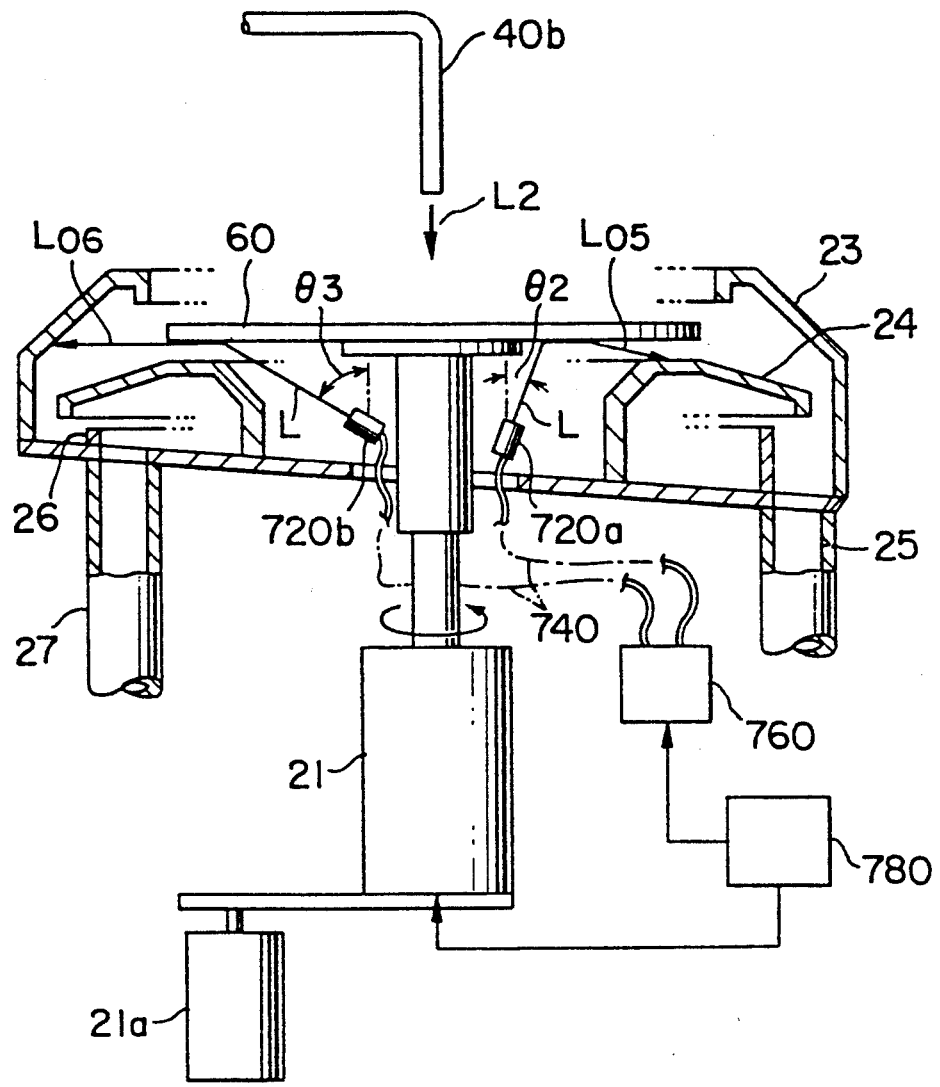
FIG. 15 is a longitudinal sectional view showing a seventh embodiment of a coating apparatus of the present invention.

In addition, the angles of inclination $\theta$ of the two washing liquid discharge nozzles 720a, 720b of the sixth embodiment can be set to the same and the rotational speed of the wafer changed when there is washing of the rear surface of the wafer, so that the washing liquid L is dispersed in the direction of the outer wall surface of the inner cup 24 and the inner wall surface of the outer cup 23, as in the configuration shown in FIG. 15. Moreover, those portions which are the same as those of the apparatus shown in FIG. 14 are denoted using the same numerals and the corresponding descriptions of them are omitted.

More specifically, the angle of inclination $\theta$ of one of the washing liquid discharge nozzles 720 is made the same angle as that for the case shown in FIG. 14, and the distance L3 from the peripheral portion of the spin chuck 20 is set to about 15 mm. Then, the rotational speed of the spin chuck 20 when there is a washing operation for the rear surface of the wafer is made constant and rotational speed of the spin chuck 20 is set so that the direction $L_{05}$ of dispersion of the washing liquid L at this time is a direction approaching the vicinity of the center portion of the outer wall surface of the inner cup 24.

Then, the angle of inclination $\theta 3$ of the other washing liquid discharge nozzle 720 is set to be larger than the above described angle of inclination $\theta 2$ and the discharged washing liquid strikes substantially the center portion in the direction of the radius of the wafer, and the dispersion direction $L_{06}$ of the washing liquid L with respect to the rotational speed when the rear surface of the wafer is washed becomes substantially horizontal with respect to the surface of the wafer. More specifically, this angle of inclination $\theta 3$ is set to an angle so that the washing liquid L dispersed from the rear surface of the wafer reaches the inside wall surface of the outer cup 23.

In this manner, the preliminary setting of the angles of inclination of the two washing liquid discharge nozzles 720a, 720b so as to be different enables the simultaneous cleaning of the outer wall surface of the inner cup 24 and the inner wall surface of the outer cup 23 without changing the rotational speed of the wafer when the rear surface is washed, and enables the same effect as the other embodiments described above.

Figure 16:
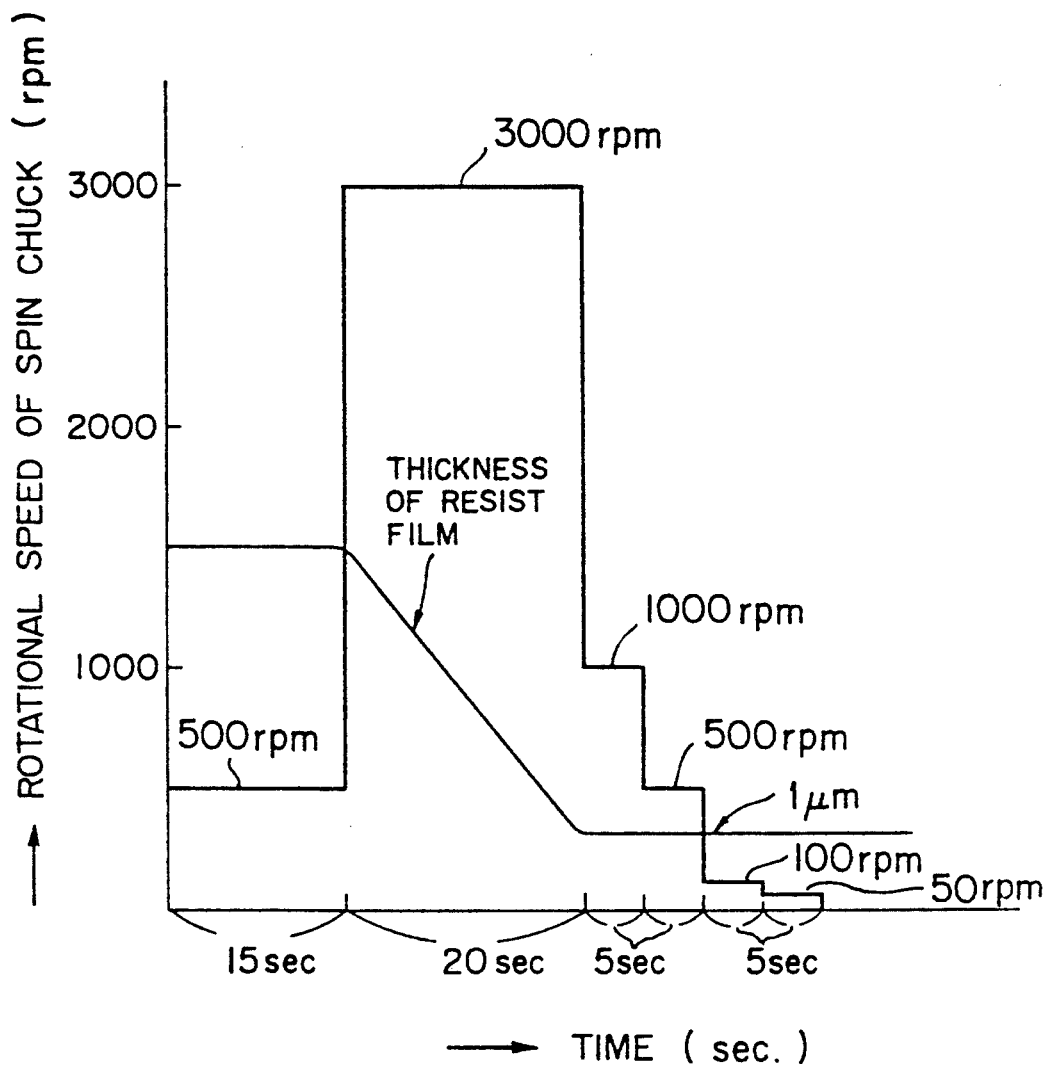
FIG. 16 is a line diagram showing the relationship between the rotational speed of the spin chuck of the coating apparatus of a sixth embodiment shown in FIG. 13, and the holding time and the resist film thickness.
Figure 17:
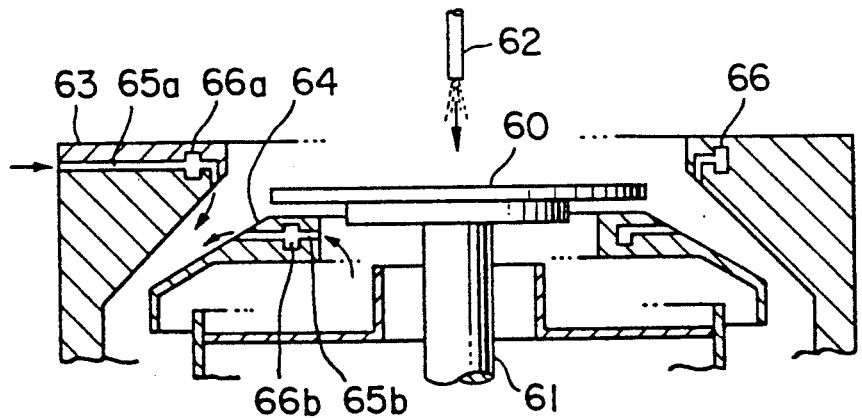
FIG. 17 is a longitudinal sectional view of a conventional coating apparatus.
Figure 18:
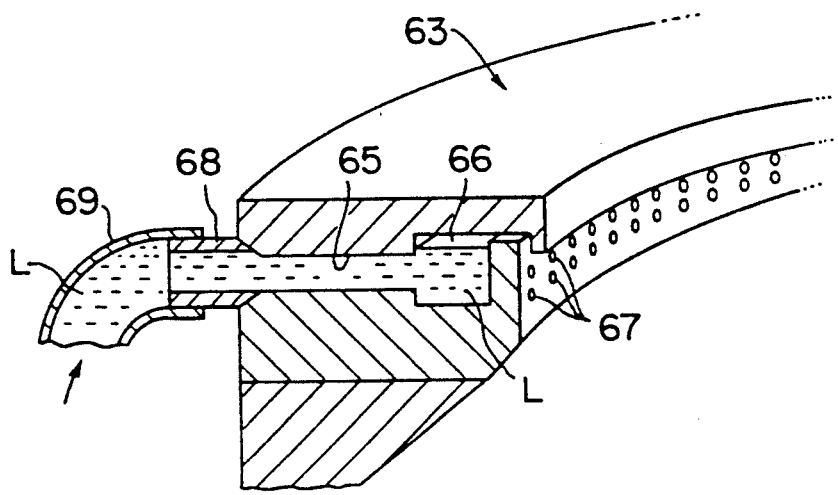
FIG. 18 is a longitudinal partial sectional view of a coating apparatus shown in FIG. 17.
Figure 19:
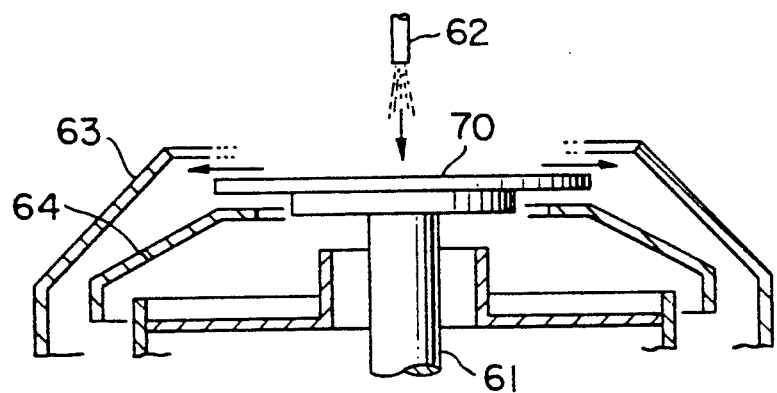
FIG. 19 is a longitudinal sectional view of another conventional coating apparatus.

In addition, in the coating apparatus of the embodiments shown in FIG. 13 through FIG. 15, as shown in FIG. 16, a required amount of coating liquid is dropped onto the object to be coated (a wafer) and the object to be coated is then rotated at a speed of 500 r.p.m. for 15 seconds for example, and then at a speed of 3,000 r.p.m. for 20 seconds for example, and a resist film of 1 $\mu$m thickness for example, is then formed on the surface of the object of coating. After the formation of this resist film, the washing liquid supply portion is then driven and washing liquid discharged from both washing liquid discharge nozzles, while the rotational speed of the object of coating is reduced in five-second stages to 1,000, 500, 100 and 50 r.p.m. and side rinsing and rear surface washing of the object of coating performed and the coating liquid which has attached there is washed along with the outer wall surface of the inner cup and the inner wall surface of the outer cup. Moreover, the rotational speed of the object of coating when washing is performed can be increased instead of decreased, or there can be an increase or decrease without stepping.

Moreover, the object of coating in the present invention is not limited to semiconductor wafers, and can for example be printed circuit boards, LCD substrates or the like, and furthermore, the present invention is not limited in application to resist coating apparatus, and can for example be applied to developer liquid coating apparatus, etching liquid coating apparatus, magnetic liquid coating apparatus, washing apparatus and the like.

As has been described above, an excellent operational effect is exhibited by the sixth and seventh embodiments of the present invention.

Washing of the rear surface of an object for coating and washing of the wall surfaces of a container are performed at the same time and so it is not necessary to have an individual operation for container washing as in the case of a conventional apparatus, and it is therefore possible to greatly increase the production efficiency and the processing efficiency.

In addition, it is possible to simplify the structure of the container itself and so it is not only possible to greatly reduce the cost of the apparatus, but it is also possible to simplify maintenance.

What is claimed is:

1. A coating apparatus comprising:
   rotating and holding means for holding and rotating an object to be coated;
   a container which encloses said rotating and holding means and prevents dispersion of coating liquid supplied to an object to be coated;
   a washing liquid supply means provided above said container for supply washing liquid;

a washing fitting provided on said rotating and holding means in place of an object to be coated for discharging washing liquid supplied from said washing liquid supply means for washing off coating liquid which has attached inside said container; said washing fitting having a collection pool portion for collecting washing liquid, and discharge holes through which washing liquid in said collection pool portion is discharged by rotation of said rotating and holding means.

2. The coating apparatus of claim 1, comprising a moving mechanism for moving said rotating and holding means up and down.

3. The coating apparatus of claim 1, wherein said discharge holes are formed in plural in an outer peripheral portion of said washing fitting, and are aligned at an angle with respect to a horizontal plane through said washing fitting.

4. The coating apparatus of claim 1, wherein a center of a receiving portion of said washing fitting is formed with a conical shaped protrusion.

5. The coating apparatus of claim 1, wherein said discharge hole is provided singly.

6. The coating apparatus of claim 1, wherein said pool portion is located at a side of a lower surface of a peripheral edge portion of said washing fitting.

7. The coating apparatus of claim 1, wherein said rotating and holding means is a spin chuck.

8. A coating apparatus comprising:
rotating and holding means for holding and rotating an object to be coated; and
a container which encloses said rotating and holding means and prevents dispersion of coating liquid supplied to an object to be coated;
said rotating and holding means being provided with a washing liquid guide portion, a supply nozzle, for supplying washing liquid for washing off coating liquid which has attached to said container, provided adjacently and facing said washing liquid guide portion, whereby washing liquid discharged from said supply nozzle is dispersed inside said container via said washing liquid guide portion of said rotating and holding means.

9. A coating apparatus comprising:
rotating and holding means for holding and rotating an object to be coated; and
a container which encloses said rotating and holding means and prevents dispersion of coating liquid supplied to an object to be coated;
said rotating and holding means being provided with a pool portion which pools washing liquid for washing off coating liquid which has attached to said container, and discharge holes for discharging washing liquid from said pool portion in a direction of inside walls of said container due to rotation of said rotating and holding means.

10. The coating apparatus of claim 8, wherein said rotating and holding means is formed so as to be reciprocally movable in a direction of an axis of rotation.

11. The coating apparatus of claim 8, wherein said washing liquid guide portion is located on a side of a lower portion of said rotating and holding means and inclines from one end of a peripheral edge portion thereof to another end thereof.

12. The coating apparatus of claim 9, wherein said pool portion includes a plurality of washing liquid receiver portions formed in a side of a rear surface of said rotating and holding means, each said washing liquid receiver portion being respectively connected to a freely movable washing liquid supply nozzle and having a corresponding discharge hole.

13. The coating apparatus of claim 9, wherein a peripheral edge portion of a side of a rear surface of said rotating and holding means is provided with said pool portion, said pool portion being ring shaped and connected to said discharge holes, and wherein said washing liquid supply nozzles oppose said pool portion.

14. The coating apparatus of claim 9, wherein said rotating and holding means forms said pool portion which has the shape of a circular plate with a hole at its center, and which has a washing liquid guide inlet provided to a center portion of an upper surface thereof.

15. The coating apparatus of claim 8, wherein: said rotating and holding means is a spin chuck.

16. A coating apparatus comprising:
rotating and holding means for holding and rotating an object to be processed;
a container which encloses said rotating and holding means and prevents dispersion of coating liquid supplied to an object to be processed;
a washing liquid discharge nozzle which discharges washing liquid in a direction of a rear surface of an object to be processed as such object is held by said holding and rotating means; and
control means for gradually changing a rotational speed for said rotating and holding means when a rear surface of an object to be processed is to be washed, whereby washing liquid which has struck a rear surface of such object is dispersed in a direction of a wall surface of said container.

17. The coating apparatus of claim 16, wherein plural washing liquid discharge nozzles are provided at a required angle of inclination with respect to an axis of rotation of a plurality of rotating and holding means.

18. A coating apparatus comprising:
rotating and holding means for holding and rotating an object to be processed;
a first container which encloses said rotating and holding means and prevents dispersion of coating liquid supplied to such object to be processed;
a second container located coaxially in said first container and underneath said rotating and holding means;
a first washing liquid discharge nozzle provided so as to lead, to the entire surface of said first container, washing liquid discharged in a direction of such object; and
a second washing liquid discharge nozzle provided so as to lead, to the entire surface of said second container, washing liquid discharged in a direction of such object.

19. The coating apparatus of claim 17, wherein respective angles of inclination of said washing liquid discharge nozzles are the same.

20. The coating apparatus of claim 17, wherein respective angles of inclination of said washing liquid discharge nozzles are different.

21. The coating apparatus of claim 9, wherein said rotating and holding means is formed so as to be reciprocally movable in a direction of an axis of rotation.

22. The coating apparatus of claim 9, wherein:
said rotating and holding means is a spin chuck.

* * * * *